United States Patent [19]

Rouquier et al.

[11] Patent Number: 4,995,236
[45] Date of Patent: Feb. 26, 1991

[54] CRYOSTATIC DEVICE FOR A RADIATION DETECTOR

[75] Inventors: Pierre Rouquier, Versailles; Michel Pele, Saint-Benoit; André Ic, Dourdan; Pierre Crestey, Biard, all of France

[73] Assignee: Société Anonyme de Telecommunications, France

[21] Appl. No.: 420,154

[22] Filed: Oct. 11, 1989

[30] Foreign Application Priority Data

Oct. 13, 1988 [FR] France ................... 88 13470

[51] Int. Cl.⁵ .............................. F25B 19/00
[52] U.S. Cl. .................... 62/51.1; 174/15.6; 250/352
[58] Field of Search ............... 62/51.1; 250/352; 174/15.6

[56] References Cited

U.S. PATENT DOCUMENTS

| | | | |
|---|---|---|---|
| 3,654,377 | 4/1972 | Fleming et al. | 62/47.1 |
| 4,118,947 | 10/1978 | Diedrich et al. | 62/51.1 |
| 4,324,104 | 4/1982 | Horn et al. | 62/51.2 |
| 4,462,214 | 7/1984 | Ito | 62/51.1 |
| 4,501,131 | 2/1985 | Gaskin et al. | 62/51.2 |
| 4,546,614 | 10/1985 | Kline et al. | 62/51.1 |
| 4,546,621 | 10/1985 | Kline et al. | 62/51.1 |
| 4,692,560 | 9/1987 | Hotta et al. | 62/51.1 |
| 4,712,388 | 12/1987 | Sullivan et al. | 62/51.1 |
| 4,739,633 | 4/1988 | Faris | 174/15.6 |
| 4,833,898 | 5/1989 | Chudy et al. | 250/352 |

FOREIGN PATENT DOCUMENTS

| | | |
|---|---|---|
| 058645 | 8/1982 | European Pat. Off. . |
| 0213421 | 11/1987 | European Pat. Off. . |
| 54-60982 | 5/1979 | Japan . |
| WO88/04037 | 6/1988 | PCT Int'l Appl. . |

Primary Examiner—Ronald C. Capossela
Attorney, Agent, or Firm—Jacobs & Jacobs

[57] ABSTRACT

A cryostatic device is divulged for radiation detectors, disposed at the end of a cooled finger. A case, transparent to the radiation to be detected, at least in the vicinity of the detector, forms about the finger and the detector a heat insulating enclosure. An electric circuit brings the detected signal(s) outside the enclosure and radially immobilizes the end of the finger with respect to said case, because its substrate is a disk fast both with said case and with the end of the finger.

8 Claims, 3 Drawing Sheets

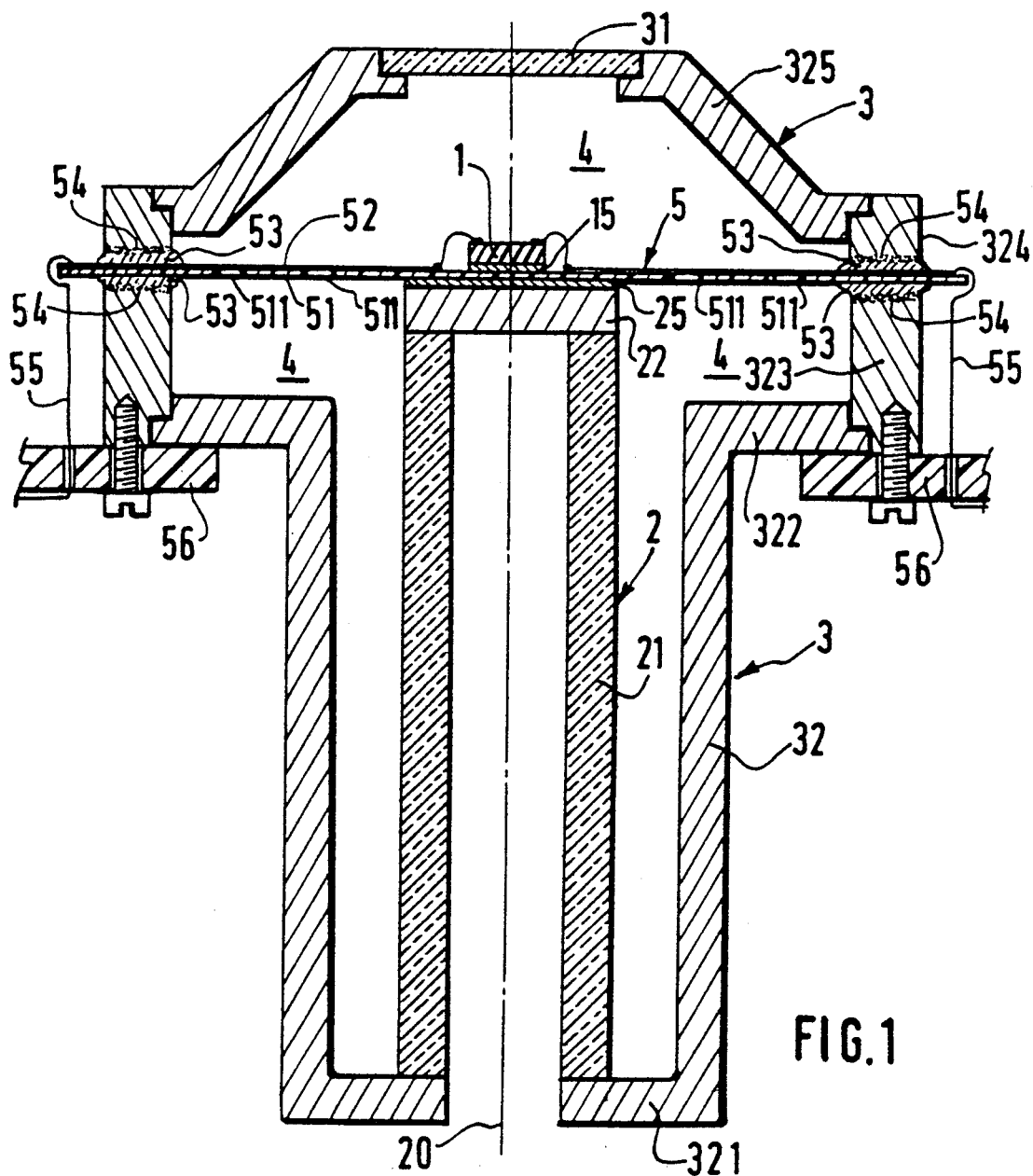
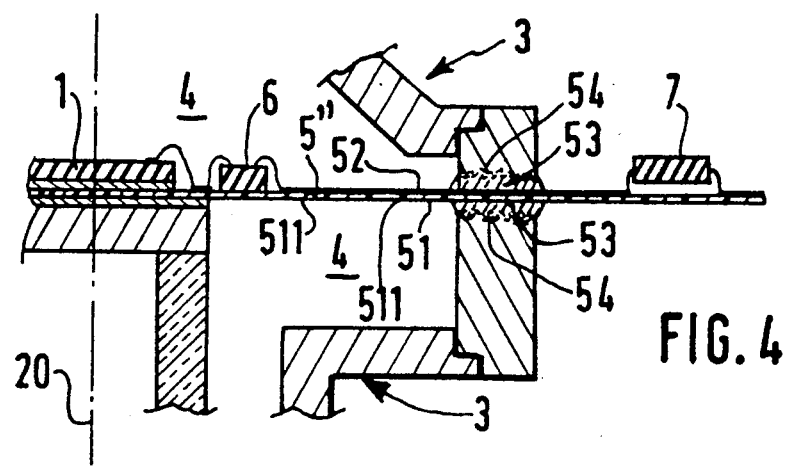

CRYOSTATIC DEVICE FOR A RADIATION DETECTOR

BACKGROUND OF THE INVENTION

1. Field of the Invention

The present invention relates to a cryostatic device for a radiation detector comprising:

a finger, cooled and having an end supporting at least one radiation detector delivering a detected signal, a case, surrounding said finger and said detector and transparent to said radiation at least in the vicinity of said detector, so as to form about said finger and said detector a heat insulating enclosure, and an electric circuit for bringing said detected signal outside said enclosure.

The purpose of such a device is to maintain a radiation detector or an array of detectors, for example infrared detectors, at a suitable very low temperature. In fact, these detectors are made from semi-conductor materials which must be brought to a very low temperature in order to have good detection performances.

Such a device applies particular to infrared cameras and self-homing devices.

2. Description of the Prior Art

Devices of the above type are already known, particularly from the applications FR 2 530 382 and FR 2 256 385. These devices however have the following drawbacks. When they are subjected to a high vibration level, instabilities appear in the image obtained from the detected and processed signals and in addition parasite noise signals are sometimes superimposed on the detected signals in random fashion, which degrades the quality of the image obtained.

The present invention aims at overcoming the preceding drawbacks.

SUMMARY OF THE INVENTION

For this, it provides a device of the above type, characterized by the fact that said electric circuit comprises:

a disk made from an electrically insulating material, extending in a plane perpendicular to the axis of said finger, and having a central portion fast with said end of the finger and a peripheral portion fast with said case and which passes therethrough from radially immobilizing said end of the finger with respect to said case, and a plurality of conductors supported by said disk.

With the device of the invention, the image obtained is stable, even when the device is used on board a tank, for example. This remarkable result was obtained by the Applicant who thought that the origin of the instabilities of the image observed in this case was to be sought in the fact that the finger, fast by its base with the rest of the tank, was likely to enter into mechanical resonance, like an embedded vibrating beam, under the effect of the vibratory excitation due to the movement of the tank. In the device of the invention, the finger cannot enter into mechanical resonance for its end is radially fast with the case, which is dimensioned to remain always motionless relative to the body of the tank. The finger is then also immobilized with respect to the body of the tank and the image obtained is stable.

In addition, there no longer any parasite noises superimposed on the detected signals. This other remarkable result was obtained by the Applicant who observed that, since this noise only appeared for certain values of the mechanical excitation frequency, it was certainly related to the mechanical vibrations undergone by the circuit bringing the detected signal(s).

In the present invention, because this circuit, in addition to its function of bringing the detected signal(s) provides also the mechanical connection between the end of the finger and the case, it is no longer free to move as in some prior art devices, and a reduction of the electric noise result therefrom.

It is true that a device is known from the application EP-A-0 058 645 in which the conductors bringing the electric signals, to a certain extent oppose the movements of the end of the finger. In this device, the electric circuit comprises an annular substrate fast with the case and which passes therethrough and which supports a plurality of pins perpendicular to the substrate and connected electrically to the detector by fine wires. However, the immobilization of the end of the finger provided by such a structure is imperfect to the extent that the pins may bend under the action of high stresses, thus allowing movement of the end of the finger. In addition, the fine wires which connect the pins to the detector risk in this case breaking.

In the present invention, the characteristic according to which the substrate of the conductor circuit is a disk whose central portion is fast with the end of the finger is particularly advantageous because it makes it possible to efficiently immobilize the end of the finger relative to the case, while permitting a disk of smaller thickness to be used, which increases the heat resistance between the end of the finger and the case, so as to avoid heating of the finger by heat coming from the case, via the disk.

Again advantageously, said material is rigid and said disk is provided with a plurality of slits, extending along arcs of concentric circles centred on the center of said disk and disposed so as to form baffles opposing heat exchanges between said central portion and said peripheral portion.

The baffles further increase the heat resistance of the disk so as to confer excellent thermal behavior on the assembly. In addition, the rigidity of the support provides substantially perfect immobility of the conductors, even when the device is subjected to high mechanical excitation, which further reduces the electric noise. Furthermore, the structure of the slits of the disk make the latter deformable in the direction of the axis of the finger, which makes it possible to tolerate a disparity in the variations of length of the finger and of the case, when the temperature varies.

Again advantageously, said disk is made from a material chosen from the following : zirconia, glass, quartz, forsterite, ceramic and vitro-ceramic of MACOR (registered trademark) type.

These materials have low heat conductivities which contributes to increasing the heat resistance.

BRIEF DESCRIPTION OF THE DRAWINGS

The present invention will be better understood from the following description of the preferred embodiment of the device of the invention and some variants, with reference to the accompanying drawings in which:

FIG. 1 shows a sectional view of the cryostatic device of the invention,

FIG. 4 shows a partial section of a variant of the device of FIG. 1.

DESCRIPTION OF THE PREFERRED EMBODIMENT

Figure 2:
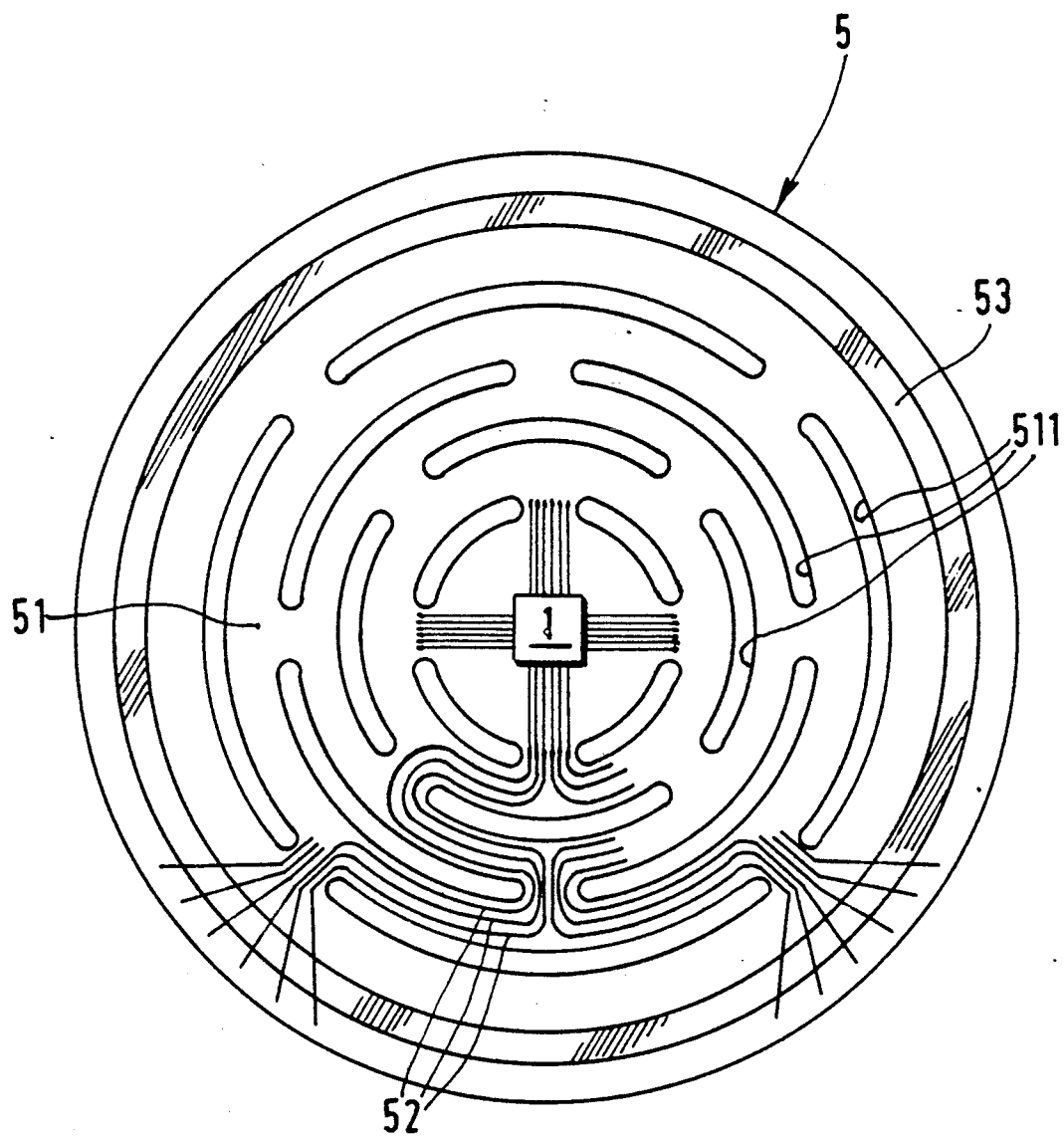
FIG. 2 shows a top view of the electric circuit of the device of FIG. 1.

Referring to FIG. 1, a cryostatic device for a radiation detector, here an array 1 of infrared detectors, will now be described.

As is known, an array of infrared detectors of the type of array 1, used for example in an infrared camera must be cooled to a very low temperature, for example to the temperature of liquid nitrogen, so as to operate satisfactorily.

For this, the array 1 is disposed at the the end of a cooling finger 2. The cooling finger 2 is a hollow finger inside which is disposed a cold source, not shown. In a way known per se, the cold source is either a cryogenic liquid, or a cryogenerator, for example with Joule-Thomson effect or else a Peltier effect thermo-element. The finger here extends along an axis 20.

Finger 2, supporting then at its end the array 1 of detectors, is surrounded by a case 3, which forms about finger 2 and array 1 a heat insulating enclosure 4 which is evacuated or filled with a low heat conducting gas.

Case 3 is provided, in the zone close to the array 1 of detectors, with a window 31 transparent to the infrared radiation to be detected, e.g. germanium or a special glass.

In response to the infrared radiation which they receive through window 31, each of the detectors of array 1 delivers an electric signal or detected signal. The detected signals are brought outside the enclosure 4 by an electric circuit 5.

The electric circuit 5 is here a printed circuit which comprises, as shown in FIG. 2, an electrically insulating disk 51 which supports a plurality of conducting tracks or electric conductor 52. As is clear from FIG. 1, disk 51 extends in a plane perpendicular to the axis 20 of said finger.

The central portion of disk 51 is fixed to the end of the finger 2 by bonding or sealing, using a material having an expansion coefficient compatible with that of the finger, forming a layer 25. The array 1 of detectors is bonded by an adhesive layer 15 to the free face of the central portion of disk 51 disposed opposite the end of finger 2, so that the detectors are suitably cooled. The outputs of each of the detectors are connected to conductors 52, for example by connections formed in a way known per se by thermo-compression.

The peripheral portion of disk 51 passes through case 3, to which it is secured in a way which will be explained further on. Thus, conductors 52 are available outside enclosure 4.

Disk 51 is provided with a plurality of slits 511. The slits 511 extend along the arcs of concentric circles centered on the center of disk 51 and form baffles, so that any path between the central portion and the peripheral portion of the disk 51 and following the material of the disk is a meandering path as long as possible, this path being further identical with that followed by conductors 52, which extend also from the central portion to the peripheral portion of the disk 51, as shown in FIG. 2. Here, four identical slits 511 of a length slightly less than a quarter of a circle are disposed on each of the concentric circles and the four solid portions between the four identical slits are offset by 45° from one circle to another.

The slits 511 have a threefold function:

firstly, they oppose the heat exchanges between the central portion and the peripheral portion of the disk 51, because they make the paths in the material of the disk longer, secondly, they confer on disk 51 even if it is made from a rigid material, a deformability compatible with a difference of temperature behavior of finger 2 and enclosure 3, in particular in the direction defined by axis 20, and - thirdly, they make possible the communication of the two portions of cavity 4 situated on each side of disk 51, for good homogeneity of the vacuum or, as the case may be, of the gaseous contents of these two portions.

Finger 2 here comprises a body 21, in the form of a hollow circular cylinder with axis 20. Body 21 is here made from glass. Its upper end, in FIG. 1, which corresponds to the end of the finger 2, is closed by a metal disk 22 on which disk 51 is fixed, as has already been mentioned.

Case 3 comprises a body 32 substantially in the form of a hollow circular cylinder with axis 20, having a diameter greater than that of body 21 and disposed thereabout. The lower end, in FIG. 1, of body 32 comprises an edge 321 extending in a cross sectional plane towards axis 20 and connected to the lower end, in FIG. 1, of body 21, i.e. to the base of finger 2. The upper end, in FIG. 1, of body 32 comprises an edge 322 extending in a cross sectional plane away from axis 20.

A first wall 323, in the form of a hollow circular cylinder with axis 20, having a diameter greater than that of body 32, is connected to edge 322. Wall 323 is made from a metal alloy having a temperature expansion coefficient close to that of glass, for example the nickel, cobalt and iron alloy known under the name of DILVER P (registered trademark).

The height of wall 323 is such that the peripheral portion of disk 51 bears on the upper edge, the FIG. 1, of wall 323. In the bearing zone, each face of disk 51 is coated with a layer of glass 53 and the glass layer 53 of the lower face, in FIG. 1, is welded to the wall 323 by a glass-metal weld 54.

A second wall 324, in the form of a circular cylinder with axis 20, having the same diameter as wall 323 and made from the same material, bears on the glass layer 53 of the upper face, in FIG. 1, of disk 51 and its lower edge, in FIG. 1, is welded to this glass layer 53 by a glass-metal weld 54.

A metal wall 325, substantially in the form of a truncated cone with axis 20, connects together the second wall 324 and window 31, extending in a plane perpendicular to axis 20.

Naturally, the different parts which have been described are assembled together in a way known per se so that enclosure 3 is hermetic. Laser sealing is used for example, for the metal-metal assemblies and welds for the glass-metal assemblies. A nipple is provided, not shown, for evacuating the enclosure and, if required, filling the enclosure 4 with a low heat conducting gas.

Disk 51 is here made from zirconium oxide, or zirconia.

This material is a rigid electrically insulating material which has low heat conductivity at the very low temperatures of operation of the infrared detectors.

Disk 51 has a thickness of a few tenths of a millimeter and the conducting tracks 52 are made from platinum or gold.

After deposition of a platinum or gold layer on disk 51, for example by evaporation, the conducting tracks 52 are etched, for example by laser, and layers 53, made from a low melting point glass, are deposited. The glass layers 53 have in this case a thickness less than a millimeter.

For the material of the disk, glass, quartz, forsterite, ceramic, a vitro-ceramic such as MACOR (registered trademark) may also be used or generally any electrically insulating material having low heat conductivity at very low temperatures. By low heat conductivity is meant here a heat conductivity less than substantially:

$$5 \ 10^{-3} \text{cal.cm/s.cm}^2.°\text{C}.$$

When it is desired to form slits in disk 51 such as slits 511, it is preferable to use a rigid material.

In FIG. 1, a circuit 5 has been shown whose only electric function is to bring the signals detected by detectors 1 out of enclosure 4. As is shown in this figure, conductors 55 connect tracks 52 to electric processing components, not shown, disposed on one or more printed circuits 56 of conventional type.

Figure 3:
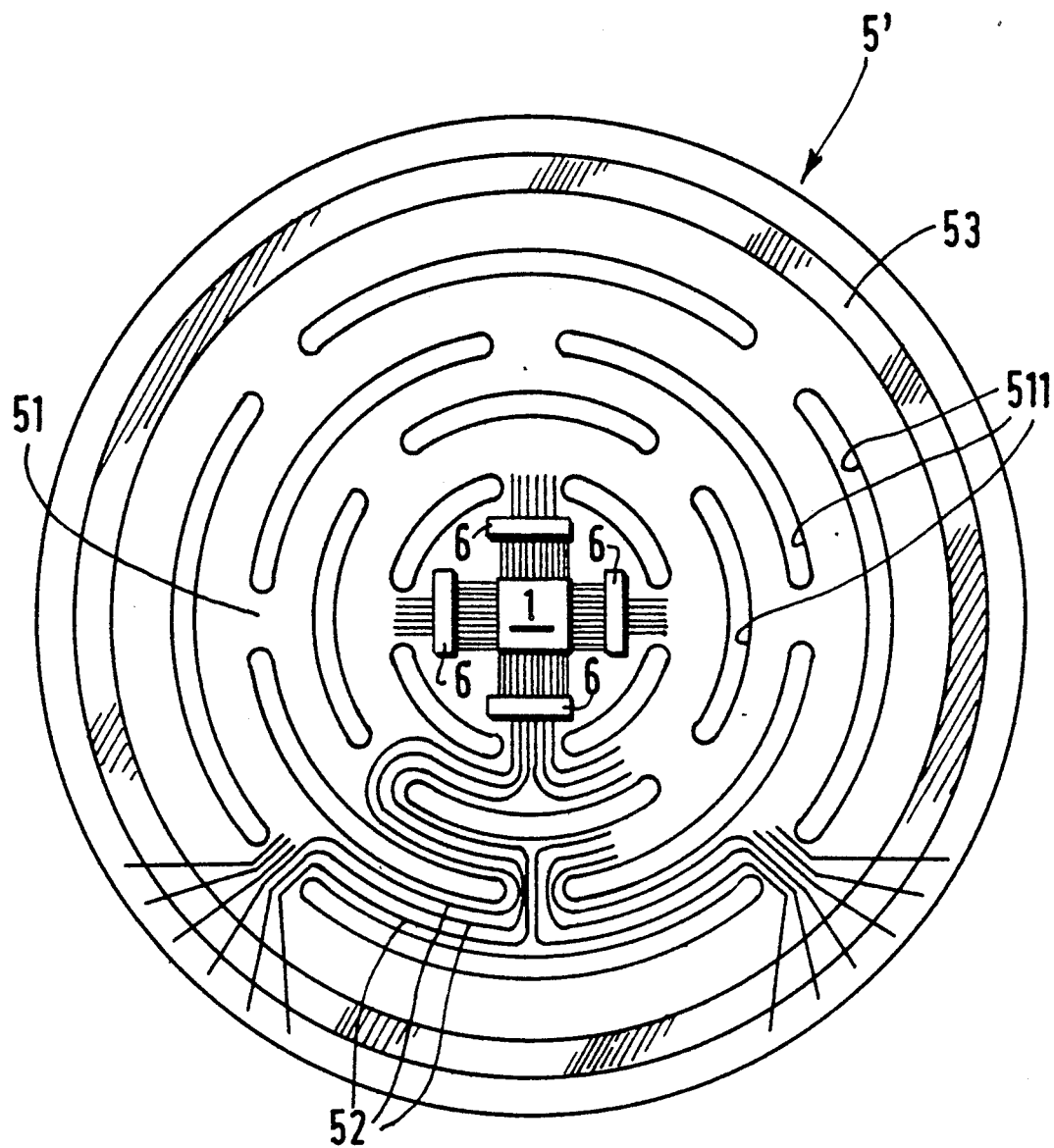
FIG. 3 shows a top view of a variant of the electric circuit of FIG. 2.

This is not obligatory and as shown in FIG. 3 a variant 5' of circuit 5 is provided for supporting electronic components 6 disposed inside enclosure 4. These components may be circuits for processing the detected signals, for example, pre-amplification, amplification, filtering, storage or multiplexing so as to reduce the number of electric conductors 52, in the case where array 1 comprises a very large number of elements. It is obviously within the scope of a man skilled in the art to determine the optimum implantation of each of these components, particularly in so far as their distance from the array 1 is concerned, taking into account their function, their efficiency when cold as well as their heat dissipation.

As shown in FIG. 4, a variant 5" of circuit 5' is provided also for supporting components 7 disposed outside the enclosure 4.

It is also possible for some of the components 6 to be electro-optical couplers so as to replace, wholly or partially, the electric conductors 52 by optical conductors or optical fibers. The advantages provided by optical fibers are well known : immunity to electromagnetic disturbances, high data flowrates, mechanical flexibility, low attenuation rate, which, in some cases, makes it possible to dispose the electronic processing part away from the cryostatic enclosure.

In the above description, the array 1 of detectors is bonded to disk 51 which is itself fixed to the the end of the finger 2. It is also possible, in order to improve the heat transfer between finger 2 and array 1, to provide a recess in the central portion of disk 51 so that the array 1 is bonded directly to finger 2.

We claim:

1. A cryostatic device for a radiation detector, comprising:
   (a) a cooled finger extending along an axis and having an end supporting at least one detector for detecting radiation and for generating a signal indicative of the detected radiation;
   (b) a case surrounding said finger and said detector and transparent to said radiation at least in the vicinity of said detector, said case forming about said finger and said detector a heat insulating enclosure; and
   (c) feed-through means for conveying said signal from the detector outside said enclosure, including
       (i) a disk made from an electrically insulating material, and extending in a plane perpendicular to the axis of said finger, said disk having a central portion fixed to said end of the finger and a peripheral portion fixed to said case, said peripheral portion passing through and beyond said case for radially immobilizing said end of the finger with respect to said case, and
       (ii) a plurality of conductors supported by said disk for conveying said signal.

2. The device as claimed in claim 1, wherein said material is rigid and wherein said disk has a center and a plurality of slits, said slits extending circumferentially along arcs of concentric circles centered on the center of said disk and being spaced radially apart to form heat-transfer-resistant baffles between said central portion and said peripheral portion of the disk.

3. The device as claimed in claim 1, wherein the material of said disk is selected from a group consisting of zirconia, glass, quartz, forsterite, ceramic and vitro-ceramic of MACOR (registered trademark) type.

4. The device as claimed in claim 1, wherein said disk has opposite faces, and wherein a glass layer is disposed on each face of the disk, at least in said peripheral portion of the disk; and wherein said case is made from a metal alloy with a temperature expansion coefficient close to that of glass, at least in the zone where said peripheral portion passes through the case, and wherein each glass layer is welded to said case.

5. The device as claimed in claim 1; and further comprising electronic components for processing the signal disposed on said disk, inside said enclosure.

6. The device as claimed in claim 5, wherein said electronic components include electro-optical couplers, and wherein said conductors include optical conductors.

7. The device as claimed in claim 1; and further comprising electronic components for processing the signal disposed on said disk, outside said enclosure.

8. The device as claimed in claim 1, wherein said central portion of the disk has a recess, and wherein said detector is bonded directly to said finger.

* * * * *